(12) United States Patent
Meng et al.

(10) Patent No.: US 7,913,749 B2
(45) Date of Patent: Mar. 29, 2011

(54) THERMAL MODULE WITH POROUS TYPE HEAT DISSIPATER

(75) Inventors: Jin-Gong Meng, Shenzhen (CN); Ching-Bai Hwang, Taipei Hsien (TW)

(73) Assignees: Fu Zhun Precision Industry (Shen Zhen) Co., Ltd., Shenzhen, Guangdong Province (CN); Foxconn Technology Co., Ltd., Tucheng, Taipei County (TW)

( * ) Notice: Subject to any disclaimer, the term of this patent is extended or adjusted under 35 U.S.C. 154(b) by 832 days.

(21) Appl. No.: 11/840,178

(22) Filed: Aug. 16, 2007

(65) Prior Publication Data
US 2008/0314576 A1    Dec. 25, 2008

(30) Foreign Application Priority Data
Jun. 22, 2007   (CN) .......................... 2007 1 0075195

(51) Int. Cl.
*F28F 7/02* (2006.01)
(52) U.S. Cl. ...................................... 165/121; 165/80.3
(58) Field of Classification Search ................. 165/80.2, 165/80.3, 185, 121; 361/697, 710
See application file for complete search history.

(56) References Cited

U.S. PATENT DOCUMENTS

| 6,421,239 B1 * | 7/2002 | Huang ..................... 165/104.33 |
| 2005/0103480 A1 * | 5/2005 | Pokharna et al. ............. 165/122 |
| 2006/0011336 A1 * | 1/2006 | Frul ............................. 165/185 |
| 2006/0137862 A1 | 6/2006 | Huang et al. |

FOREIGN PATENT DOCUMENTS

| CN | 2738008 Y | 11/2005 |
| CN | 2755781 Y | 2/2006 |
| CN | 1805676 A | 7/2006 |
| CN | 1929729 A | 3/2007 |
| TW | 539395 | 6/2003 |
| TW | M264559 | 5/2005 |
| TW | 200524515 | 7/2005 |
| TW | M277248 | 10/2005 |
| TW | I276392 | 7/2006 |

* cited by examiner

*Primary Examiner* — Teresa J Walberg
(74) *Attorney, Agent, or Firm* — Jeffrey T. Knapp (57) ABSTRACT

A thermal module (100) includes a centrifugal blower (20), a heat dissipater (10) and a plurality of heat transfer plates (34). The centrifugal blower includes a casing (22), a stator accommodated in the casing, and a rotor (24) rotatably disposed around the stator. The casing includes a base wall (224) and a sidewall (222) surrounding the base wall. The sidewall defines an air outlet (221) in front of the rotor. The heat dissipater is made of porous material and disposed at the air outlet of the centrifugal blower. The heat transfer plates extend into the heat dissipater so as to increase heat transfer efficiency between a heat generating electronic component and the heat dissipater.

12 Claims, 7 Drawing Sheets

THERMAL MODULE WITH POROUS TYPE HEAT DISSIPATER

CROSS-REFERENCE TO RELATED APPLICATIONS

This application is related to co-pending U.S. patent application Ser. No. 11/746,609, filed on May 9, 2007, and entitled "HEAT DISSIPATION APPARATUS WITH POROUS TYPE HEAT DISSIPATER", and co-pending U.S. patent application Ser. No. 11/833,951, filed on Aug. 3, 2007, and entitled "HEAT DISSIPATION DEVICE". The disclosures of the above-identified applications are incorporated herein by reference.

BACKGROUND OF THE INVENTION

1. Field of the Invention

The present invention relates generally to a thermal module, and more particularly to a thermal module for dissipating heat generated by electronic components, wherein the thermal module has a heat dissipater including a plurality of through pores and a plurality of heat transfer plates disposed in the heat dissipater for increasing heat dissipation efficiency of the heat dissipater.

2. Description of Related Art

Figure 7:
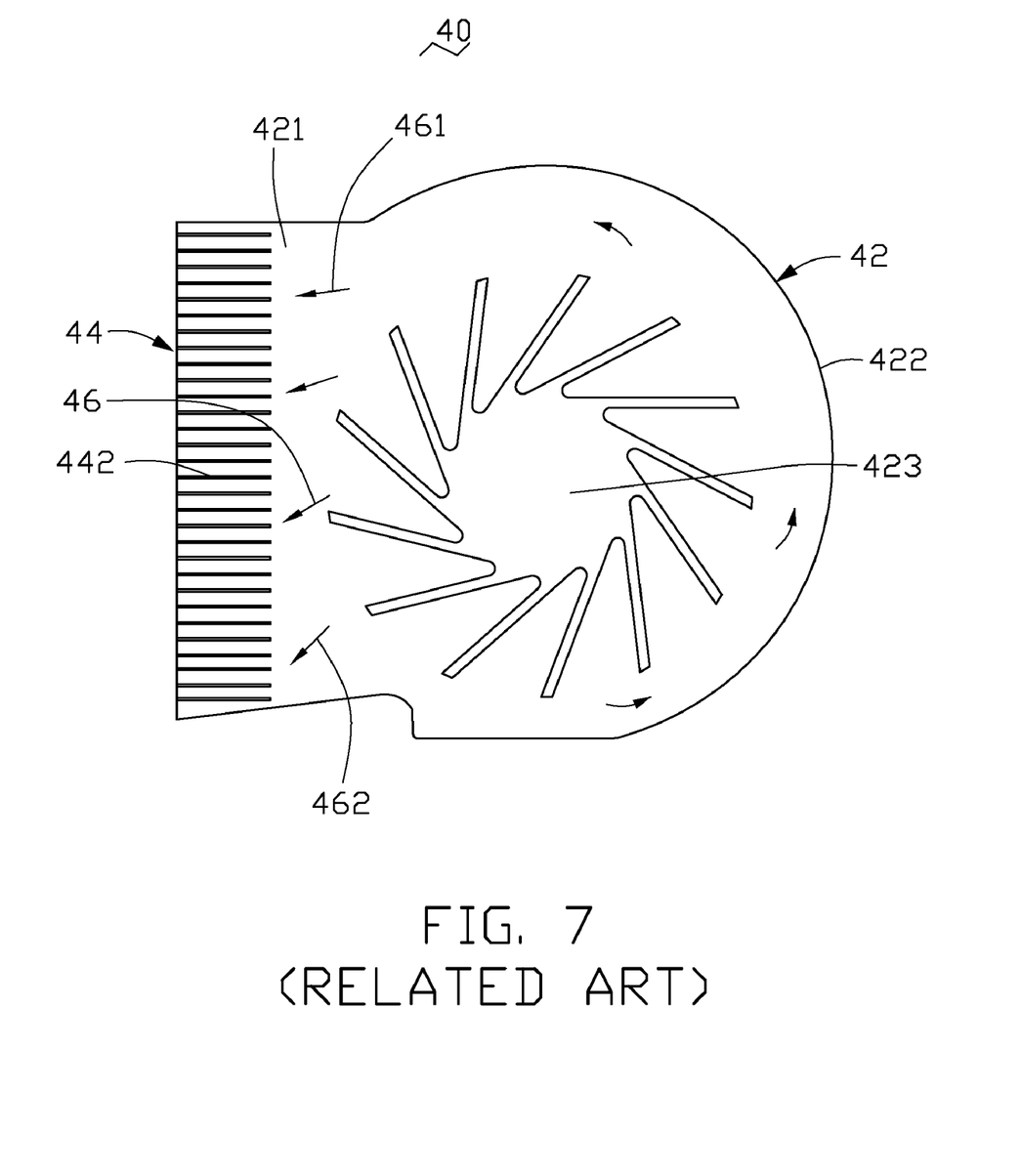
FIG. 7 is a top view of a conventional thermal module with a top cover thereof removed.

Following the increase in computer processing power that has been seen in recent years, greater emphasis is now being laid on increasing the efficiency and effectiveness of heat dissipation devices. Referring to FIG. 7, a conventional thermal module 40 includes a centrifugal blower 42 and a rectangular shaped heat dissipater 44 disposed at an air outlet 421 of the centrifugal blower 42. The heat dissipater 44 includes a plurality of stacked fins 442 which thermally connect with a heat generating electronic component (not shown) to absorb heat therefrom. The centrifugal blower 42 includes a casing 422, a stator (not shown) mounted in the casing 422, and a rotor 423 rotatably disposed around the stator. When the centrifugal blower 42 is activated, the rotor 423 rotates along a counterclockwise direction around the stator to drive airflow 46 to flow through the heat dissipater 44 to take away heat from the heat dissipater 44.

In operation of the centrifugal blower 42, the airflow leaves the centrifugal blower 42 at an upper side of the air outlet 421 and flows towards a downside of the air outlet 421. Both flow speed and air pressure of an upstream airflow 461 are greater than those of a downstream airflow 462. Therefore, the heat dissipation capability of the upstream airflow 461 is stronger than that of the downstream airflow 462. However, upstream fins 442 of the heat dissipater 44 have the same heat dissipation capability as downstream fins 442. That is, the heat dissipation capability of the upstream fins 442 does not match the heat dissipation capability of the upstream airflow 461. This causes a waste of energy of the upstream airflow 461. Accordingly, it can be seen that the heat dissipation efficiency of the thermal module 40 has room for improvement.

SUMMARY OF THE INVENTION

The present invention relates to a thermal module for dissipating heat from a heat-generating electronic component. According to a preferred embodiment of the present invention, the thermal module includes a centrifugal blower, a heat dissipater and a metallic bracket having a plurality of heat transfer plates. The centrifugal blower includes a casing, a stator accommodated in the casing, and a rotor rotatably disposed around the stator. The casing includes a base wall and a sidewall surrounding the base wall. The sidewall defines an air outlet in front of the rotor. The heat dissipater is made of porous material and disposed at the air outlet of the centrifugal blower. The heat transfer plates extend into the heat dissipater so as to increase heat transfer efficiency between a heat generating electronic component and the heat dissipater. The heat of the heat generating electronic component is first received by the metallic bracket, and then transferred to the heat dissipater via the heat transfer plates.

Other advantages and novel features of the present invention will become more apparent from the following detailed description of preferred embodiment when taken in conjunction with the accompanying drawings, in which:

DETAILED DESCRIPTION OF THE INVENTION

Figure 1:
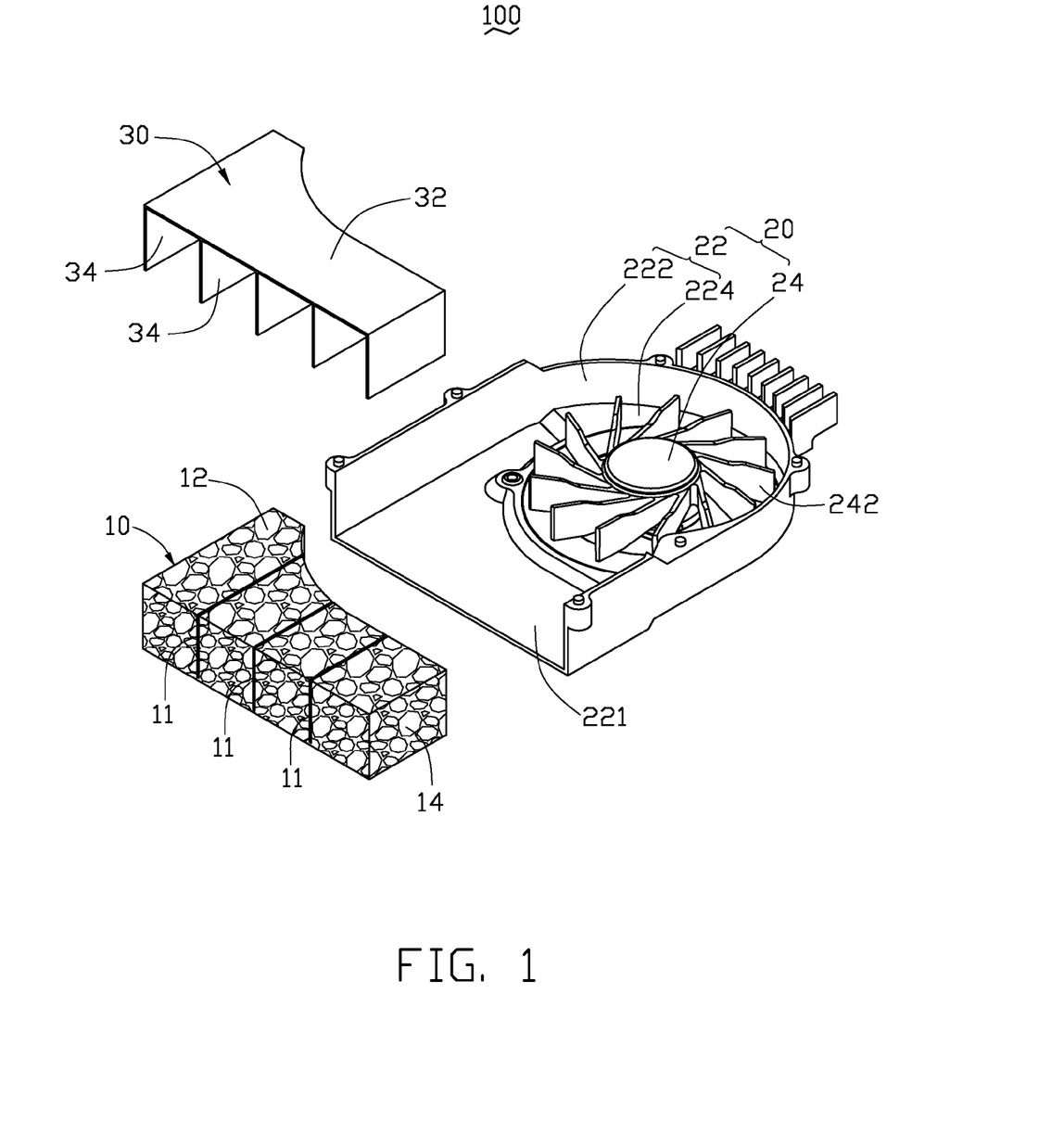
FIG. 1 is an exploded, isometric view of a thermal module according to a preferred embodiment of the present invention.
Figure 2:
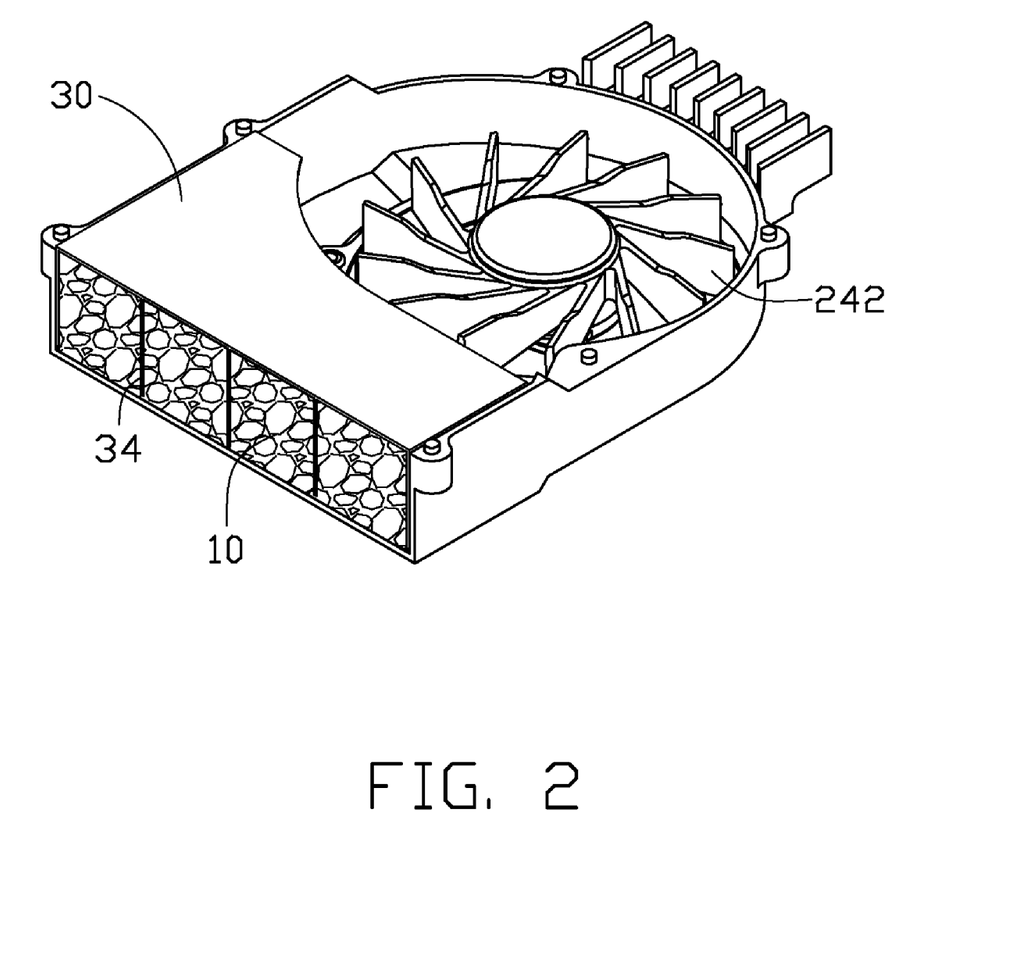
FIG. 2 is an assembled view of the thermal module of FIG. 1.
Figure 3:
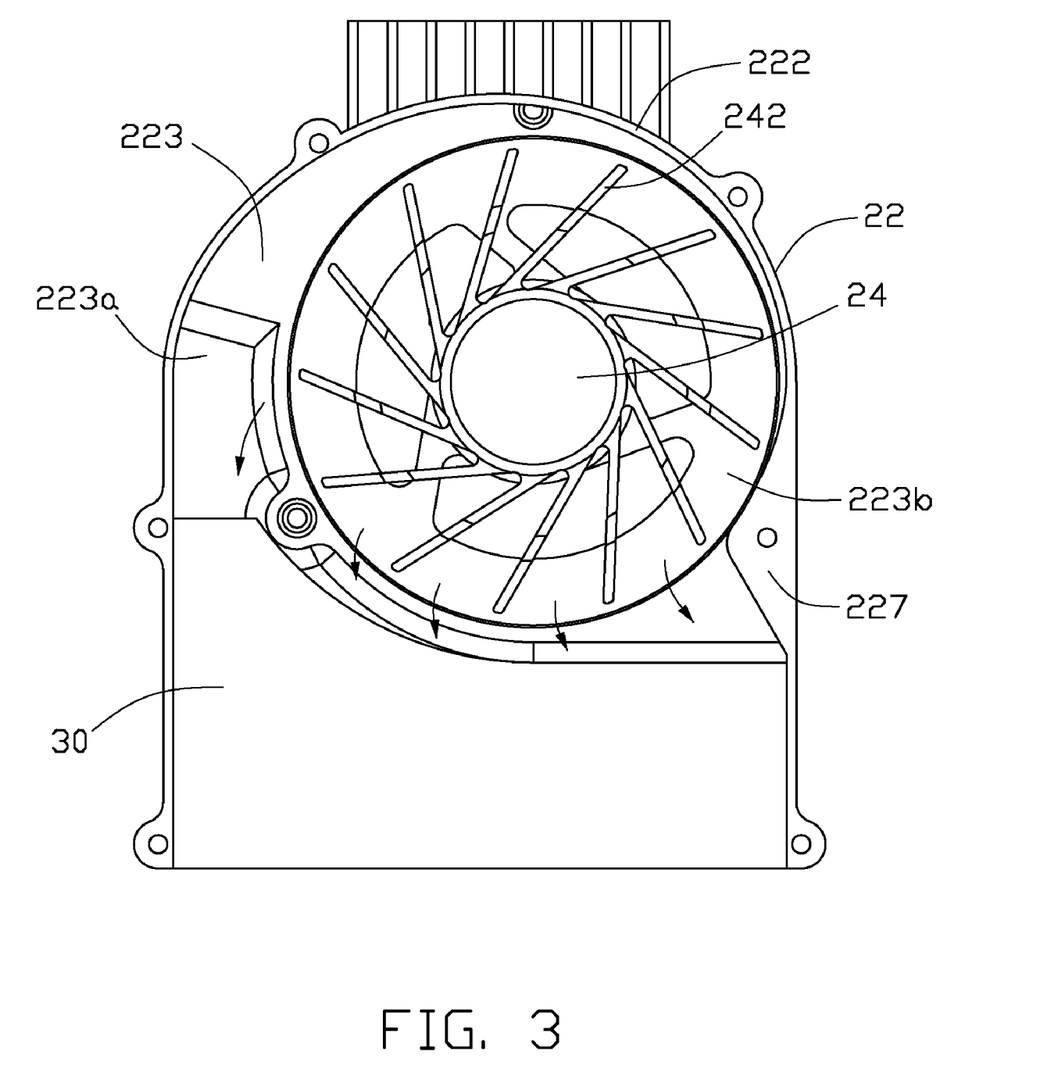
FIG. 3 is a top view of the thermal module of FIG. 2.

Referring to FIGS. 1 through 3, a thermal module 100 according to a preferred embodiment of the present invention is shown. The thermal module 100 includes a heat dissipater 10, a centrifugal blower 20 and a metallic bracket 30. The heat dissipater 10 thermally connects with a heat generating electronic component (not shown) to absorb heat therefrom. The centrifugal blower 20 provides airflow flowing through the heat dissipater 10 to take away heat from the heat dissipater 10. The bracket 30 covers and contacts with the heat dissipater 10.

The centrifugal blower 20 includes a casing 22, a stator (not shown) accommodated in the casing 22, and a rotor 24 rotatably disposed around the stator. The casing 22 includes a base wall 224, a U-shaped sidewall 222 extending perpendicularly and upwardly from the base wall 224, and a top cover (not shown) covering a portion of the sidewall 222 above the rotor 24. Referring to FIG. 3, the sidewall 222 defines a rectangular-shaped air outlet 221 in front of the rotor 24, and has a triangular tongue 227 protruding inwardly towards the rotor 24 at a portion adjacent to the air outlet 221. An air channel 223 is formed between blades 242 of the rotor 24 and an inner surface of the sidewall 222. A width of the air channel 223 gradually increases from the tongue 227 towards an end of the sidewall 222 remote from the tongue 227. The air channel 223 includes a narrow portion 223b adjacent to the tongue 227 and a wide portion 223a remote from the tongue 227. In operation, the airflow rotates in a counterclockwise direction and leaves the centrifugal blower 20 at the wide portion 223a of the air channel 223 and then flows towards the tongue 227. That is, the wide portion 223a of the air channel 223 is positioned corresponding to an upstream airflow, and the tongue 227 is positioned corresponding to a downstream airflow. A downward indent (not labeled) is defined in a top surface of the base wall 224. The indent extends from the wide portion 223a of the air channel 223 towards the air outlet 221 and through the air outlet 221 entirely. Therefore, a height of the air outlet 221 of the centrifugal blower 20 and the wide portion 223a of the air channel 223 is greater than a height of the narrow portion 223b of the air channel 223 of the centrifugal blower 20. Thus, the airflow can flow from the narrow portion 223b of the air channel 223 towards the wide portion 223a and the air outlet 221 which have a larger room, and the heat dissipater 10 can be made to have a larger heat dissipating area.

Referring to FIG. 1, the bracket 30 includes a base plate 32 covering the air outlet 221 of the centrifugal blower 20 and five heat transfer plates 34 integrally extending downwardly towards the air outlet 221. The heat transfer plates 34 are evenly distributed along a traverse direction of the air outlet 221. Alternatively, the heat transfer plates 34 may be unevenly distributed along the traverse direction of the air outlet 221. The heat transfer plates 34 have the same heights and two outermost heat transfer plates 34 are arranged to contact with the sidewall 222 of the centrifugal blower 20. The bracket 30 is made of metallic material such as copper so it has good heat transfer capability. A heat pipe (not shown) is placed to contact with a top surface of the base plate 32 of the bracket 30 so as to transfer heat from the heat generating electronic component to the bracket 30 and further to the heat dissipater 10. In this embodiment, the bracket 30 and the top cover of the centrifugal blower 20 are separately formed with each other. Alternatively, the bracket 30 may be integrally formed with the top cover from a single piece.

The heat dissipater 10 is made of porous material having a plurality of pores 14 communicated with each other to form a three-dimensional network structure. The heat dissipater 10 defines three slots 11 for receiving corresponding three of the heat transfer plates 34 therein. Thermal interfaces can be spread between the heat dissipater 10 and the bracket 30 so as to decrease heat resistance therebetween. The heat dissipater 10 is made by electroforming, die-casting, or any other suitable methods. The heat dissipater 10 can easily be made to have regular or irregular configurations, which match different centrifugal blowers 20 having different configurations so that the thermal module 100 can have optimal heat dissipation efficiency. In this embodiment, the heat dissipater 10 is made of metal foam (i.e., solid metal defining 'Swiss-cheese' style cavities) and has an irregular configuration. The heat dissipater 10 includes a tongue portion 12 extending into a part of the wide portion 223a of the air channel 223 of the centrifugal blower 20. A length of a first section of the heat dissipater 10, which corresponds to the upstream airflow and is arranged at the wide portion 223a of the air channel 223, is greater than that of a second section of the heat dissipater 10, which corresponds to the downstream airflow and is arranged adjacent to the narrow portion 223b of the air channel 223. Therefore, the first section of the heat dissipater 10 has more heat dissipation area than the second section of the heat dissipater 10. The upstream section (the first section) of the heat dissipater 10 has better heat dissipation capability, which matches the heat dissipation capability of the upstream airflow. Accordingly, the heat dissipation capability of the upstream airflow is fully utilized; thus, the heat dissipation efficiency of the thermal module 100 is increased.

In the present thermal module 100, an inner side of the tongue portion 12 of the heat dissipater 10 is disposed nearer to the blades 242 of the centrifugal blower 20 than the upstream fins 442 of the rectangular-shaped conventional heat dissipater 44 of FIG. 7. This decreases loss in kinetic energy of the airflow flowing towards the heat dissipater 10 and increases the heat dissipation efficiency of the thermal module 100. In addition, the heat dissipater 10 is made of porous material. Therefore, the present heat dissipater 10 has larger heat dissipation area than the conventional fin-type heat dissipater 44 when the present heat dissipater 10 has the same size as the conventional heat dissipater 44 of FIG. 7. Therefore, the present thermal module 100 has better heat dissipation efficiency than the conventional thermal module 40. The heat dissipater 10 includes a plurality of communicated pores 14 which increases air turbulence in the heat dissipater 10 and further increases the heat dissipation efficiency of the thermal module 100. Moreover, the heat transfer plates 34 help to transfer more heat from the heat pipe towards the heat dissipater 10, which further increases the heat dissipation efficiency of the thermal module 100.

Figure 4:
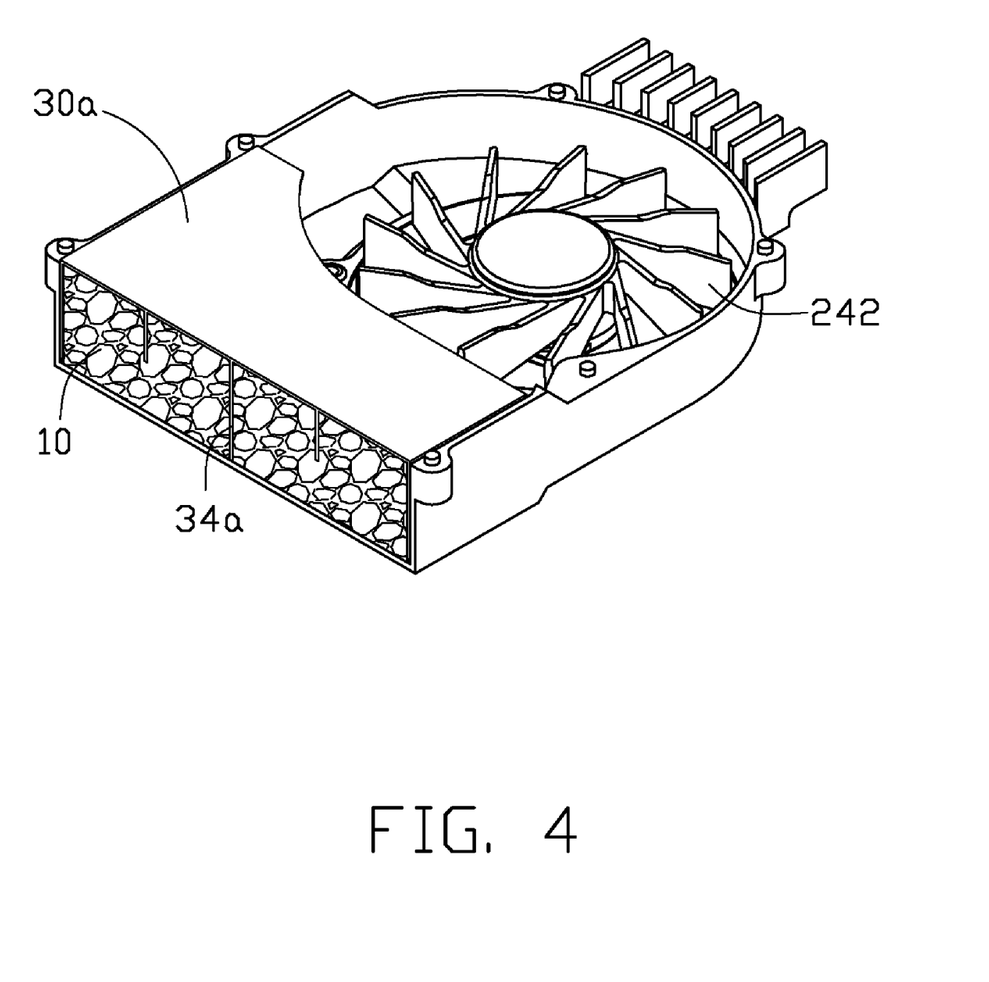
FIG. 4 is an assembled view of a thermal module according to a second embodiment of the present invention.

Referring to FIG. 4, a second embodiment of the present thermal module 100 is shown. In this embodiment, the heat transfer plates 34a of the bracket 30a have different heights. The heat transfer plates 34a of greater heights are alternately arranged with the heat transfer plates 34a of smaller heights. Specifically, the outermost and middle heat transfer plates 34a have greater heights, whilst the other two heat transfer plates 34a have smaller heights.

Figure 5:
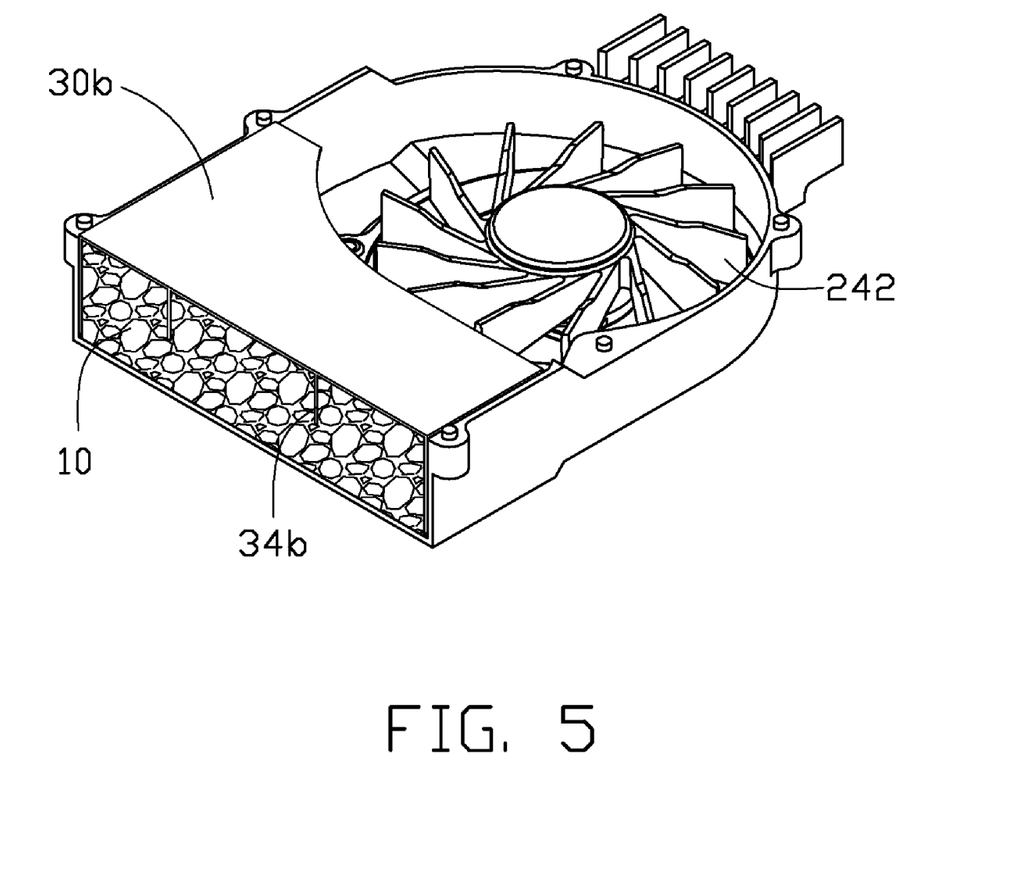
FIG. 5 is an assembled view of a thermal module according to a third embodiment of the present invention.

Referring to FIG. 5, a third embodiment of the present thermal module 100 is shown. In the third embodiment, the heat transfer plates 34b of the bracket 30b have different heights. Specifically, the outermost heat transfer plates 34b have greater heights, whilst the other two heat transfer plates 34b between the outermost heat transfer plates 34b have smaller heights.

Figure 6:
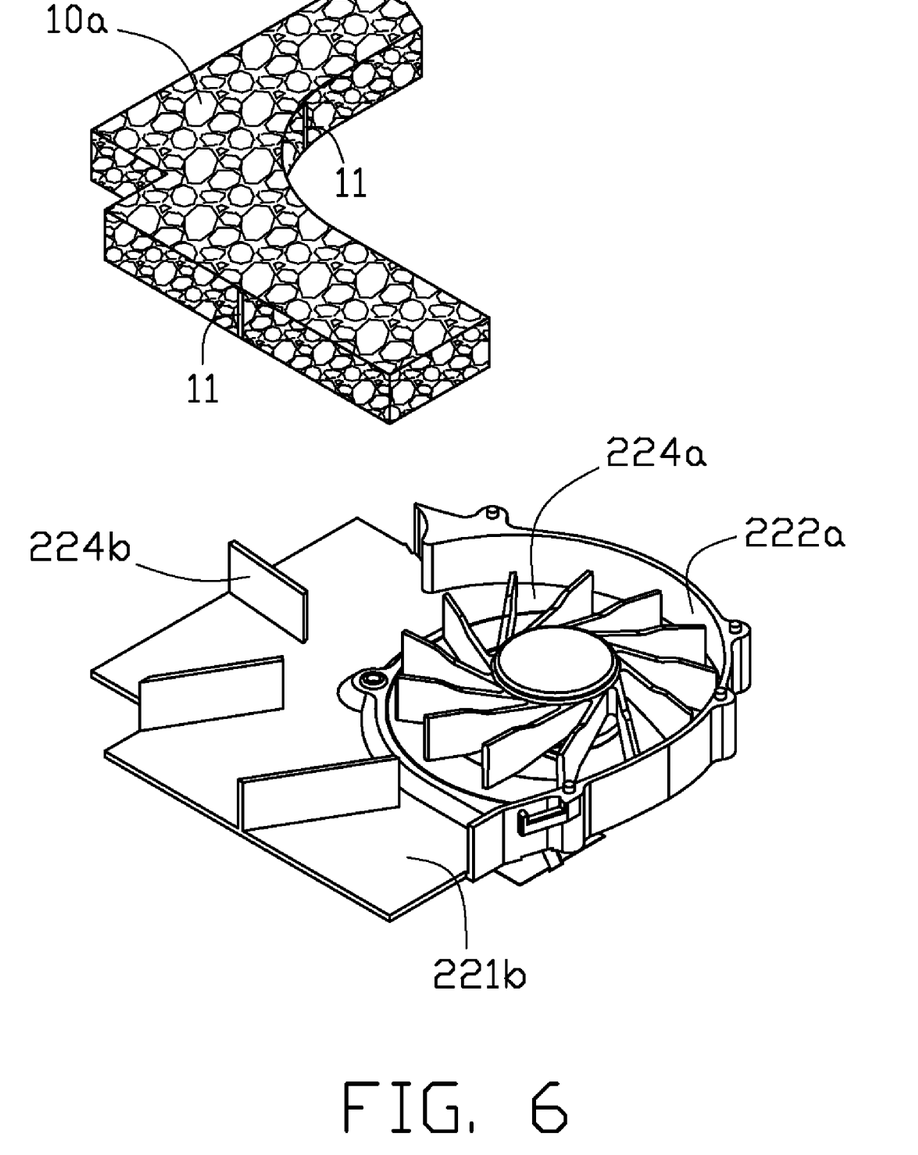
FIG. 6 is an exploded, isometric view of a thermal module according to a fourth embodiment of the present invention.

Referring to FIG. 6, a fourth embodiment of the present thermal module 100 is shown. In the fourth embodiment, the sidewall 222a of the centrifugal blower 20 is arc-shaped in profile and has an arc-shaped air outlet 221b. The heat dissipater 10a is made to have an irregular configuration to match with the air outlet 221b of the centrifugal blower 20. The base wall 224a of the centrifugal blower 20 integrally and upwardly extends three heat transfer plates 224b therefrom. Therefore, the bracket 30 of the first embodiment can be omitted, which simplifies the structure of the thermal module 100. The heat transfer plates 224b are arranged along directions of the airflow flowing through the air outlet 221b so as to decreases flow resistance of the airflow. The heat dissipater 10 defines three slots 11 in a bottom thereof; the slots 11 receive the heat transfer plates 224b therein when the heat dissipater 10a is mounted in the air outlet 221b. In this embodiment, the heat pipe can be arranged at a bottom of the base wall 224a of the centrifugal blower 20.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A thermal module comprising:
   a centrifugal blower comprising a casing, and a rotor rotatably disposed in the casing, the casing comprising a base wall and a sidewall extending upwardly from the base wall, the sidewall defining an air outlet in front of the rotor;
   a heat dissipater made of porous material and disposed at the air outlet of the centrifugal blower; and
   a bracket attached to the casing of the centrifugal blower and comprising a base plate covering the heat dissipater and a plurality of heat transfer plates integrally formed with and extending downwardly from the base plate, the heat dissipater being located between the base wall of the casing and the base plate of the bracket, and the heat transfer plates extended into the heat dissipater for receiving heat from an electronic component and transferring the heat to the heat dissipater.

2. The thermal module as described in claim 1, wherein an air channel is formed between blades of the rotor and an inner surface of the sidewall of the casing of the centrifugal blower, and the heat dissipater comprises a tongue portion extending into the air channel of the centrifugal blower.

3. The thermal module as described in claim 2, wherein the sidewall of the casing forms a tongue at one side thereof, and the air channel comprises a wide portion opposite to the tongue and a narrow portion defined between the tongue and the blades of the rotor, the tongue portion of the heat dissipater being disposed at the wide portion of the air channel of the centrifugal blower.

4. The thermal module as described in claim 3, wherein a width of the air channel is gradually increased from the tongue towards a side remote from the tongue.

5. The thermal module as described in claim 3, wherein the base wall of the centrifugal blower defines a downward indent extending from the wide portion of the air channel towards the air outlet and through the air outlet entirely.

6. The thermal module as described in claim 1, wherein the heat dissipater comprises an upstream section corresponding to an upstream airflow of an airflow generated by the rotor and flowing through the air outlet and a downstream section corresponding to a downstream airflow of the airflow, a length of the upstream section of the heat dissipater being greater than that of the downstream section of the heat dissipater.

7. The thermal module as described in claim 1, wherein the heat transfer plates have the same heights.

8. The thermal module as described in claim 1, wherein the heat transfer plates have different heights, the heat transfer plates having greater heights being alternately arranged with the heat transfer plates having smaller heights.

9. The thermal module as described in claim 1, wherein the heat transfer plates have different heights, the heat transfer plates having greater heights being arranged in contact with the sidewall of the centrifugal blower.

10. The thermal module as described in claim 1, wherein the heat transfer plates are made of metallic material.

11. The thermal module as described in claim 1, wherein the heat transfer plates extend along directions of airflows flowing through the air outlet.

12. A thermal module comprising:
  a centrifugal blower comprising a rotor for generating an airflow and a casing for housing the rotor, the casing comprising a base wall and a sidewall extending upwardly from the base wall, the sidewall defining an outlet from which the airflow leaves the centrifugal blower after flowing through an air channel;
  a porous heat dissipater disposed in the outlet and having a tongue extending into the air channel; and
  means for receiving heat from an electronic component and transferring the heat to the heat dissipater, said means comprising a base plate covering the heat dissipater and a plurality of heat transfer plates integrally formed with and extending downwardly from the base plate, the heat dissipater being located between the base wall of the casing and the base plate, and the heat transfer plates extending into the heat dissipater.

* * * * *